(12) United States Patent
Huang et al.

(10) Patent No.: US 12,151,452 B2
(45) Date of Patent: Nov. 26, 2024

(54) COMPOSITE LAMINATE PLATE, HOUSING AND MOBILE COMMUNICATION DEVICE

(71) Applicant: METAL INDUSTRIES RESEARCH & DEVELOPMENT CENTRE, Kaohsiung (TW)

(72) Inventors: Yen-Lin Huang, Kaohsiung (TW); Pei-Jung Tsai, Pingtung County (TW); Li-De Wang, Kaohsiung (TW); Chun-Chieh Wang, Kaohsiung (TW)

(73) Assignee: METAL INDUSTRIES RESEARCH & DEVELOPMENT CENTRE, Kaohsiung (TW)

( * ) Notice: Subject to any disclaimer, the term of this patent is extended or adjusted under 35 U.S.C. 154(b) by 400 days.

(21) Appl. No.: 17/450,289

(22) Filed: Oct. 8, 2021

(65) Prior Publication Data

US 2022/0176677 A1    Jun. 9, 2022

(30) Foreign Application Priority Data

Dec. 4, 2020    (TW) .................................. 109142927

(51) Int. Cl.
*B32B 15/14* (2006.01)
*B32B 3/26* (2006.01)
(Continued)

(52) U.S. Cl.
CPC .............. *B32B 15/14* (2013.01); *B32B 3/266* (2013.01); *B32B 5/02* (2013.01); *B32B 5/26* (2013.01); *B32B 15/20* (2013.01); *H05K 5/04* (2013.01); *B32B 2260/021* (2013.01); *B32B 2260/046* (2013.01); *B32B 2262/101* (2013.01); *B32B 2307/546* (2013.01); *B32B 2307/72* (2013.01); *B32B 2307/732* (2013.01);
(Continued)

(58) Field of Classification Search
CPC .......... B32B 3/266; B32B 15/14; B32B 15/20
See application file for complete search history.

(56) References Cited

U.S. PATENT DOCUMENTS

2011/0317343 A1* 12/2011 Shin ........................ H01Q 1/243
361/679.01
2012/0182190 A1* 7/2012 Yui .......................... H01Q 1/50
343/702
(Continued)

FOREIGN PATENT DOCUMENTS

CN     102039699 B    9/2015
CN     105644062 A    6/2016
(Continued)

*Primary Examiner* — Michael C Romanowski
(74) *Attorney, Agent, or Firm* — CKC & Partners Co., LLC

(57) ABSTRACT

The present invention relates to a composite laminate plate, a housing and a mobile communication device. The composite laminate includes a top metal layer with a through hole and an array antenna, and an area ratio of the array antenna to the through hole meets a specific range, thereby enhancing wave transmissivity of a millimeter wave. Moreover, the composite laminate has a specific material structure, such that it has good mechanical properties and low density. The housing and the mobile communication device made by the composite laminate have advantages of metallic texture, high signal intensity and excellent effect for light weight tendency.

12 Claims, 3 Drawing Sheets

(51) Int. Cl.
  *B32B 5/02* (2006.01)
  *B32B 5/26* (2006.01)
  *B32B 15/20* (2006.01)
  *H01Q 1/40* (2006.01)
  *H01Q 1/42* (2006.01)
  *H01Q 21/00* (2006.01)
  *H05K 5/04* (2006.01)
  *H01Q 1/27* (2006.01)
  *H01Q 3/26* (2006.01)

(52) U.S. Cl.
  CPC ............ *B32B 2457/00* (2013.01); *H01Q 1/27* (2013.01); *H01Q 1/40* (2013.01); *H01Q 1/42* (2013.01); *H01Q 3/26* (2013.01); *H01Q 21/00* (2013.01)

(56) References Cited

U.S. PATENT DOCUMENTS

| | | | | |
|---|---|---|---|---|
| 2013/0108830 A1* | 5/2013 | Wu | ........................ | B32B 3/266 428/138 |
| 2014/0125528 A1* | 5/2014 | Tsai | ........................ | H01Q 1/243 343/702 |
| 2014/0132466 A1* | 5/2014 | Inoue | ........................ | H01Q 1/22 343/904 |
| 2014/0363623 A1* | 12/2014 | Sun | ........................ | B32B 7/12 428/209 |
| 2016/0020165 A1* | 1/2016 | Kamgaing | ........ | H01L 23/49894 257/532 |
| 2016/0181688 A1* | 6/2016 | Gu | ........................ | H01Q 1/242 343/702 |
| 2016/0192517 A1* | 6/2016 | Tsao | ..................... | H04B 1/3888 361/679.01 |
| 2016/0236445 A1* | 8/2016 | Kang | ..................... | B32B 15/20 |
| 2017/0110787 A1* | 4/2017 | Ouyang | ............... | H01Q 1/42 |
| 2017/0185108 A1* | 6/2017 | Sasaki | ..................... | B32B 15/18 |
| 2017/0297242 A1* | 10/2017 | Li | ........................... | H05K 5/04 |
| 2017/0346175 A1* | 11/2017 | Zhao | ..................... | B32B 15/20 |
| 2018/0009143 A1* | 1/2018 | Abe | ........................ | H05K 5/04 |
| 2018/0042130 A1* | 2/2018 | Li | ........................... | H05K 5/0247 |
| 2018/0090816 A1* | 3/2018 | Mow | ..................... | H01Q 9/0421 |
| 2018/0138589 A1* | 5/2018 | Clegg | ..................... | H05K 1/032 |
| 2018/0151947 A1* | 5/2018 | Apostolos | ............ | H01Q 1/2291 |
| 2018/0168057 A1* | 6/2018 | Peralta | ..................... | H04B 5/26 |
| 2018/0205146 A1* | 7/2018 | Huang | .................... | H01Q 1/521 |
| 2018/0213637 A1* | 7/2018 | Hosoda | .................. | B32B 3/266 |
| 2018/0310423 A1* | 10/2018 | Koo | ........................ | H05K 5/04 |
| 2018/0366811 A1* | 12/2018 | Huang | .................... | H01Q 1/243 |
| 2019/0103657 A1* | 4/2019 | Wang | ................... | H04M 1/0249 |
| 2019/0160784 A1* | 5/2019 | He | .......................... | B32B 3/266 |
| 2019/0237862 A1* | 8/2019 | Hamaguchi | ............... | B32B 7/12 |
| 2019/0312331 A1* | 10/2019 | Sakurai | ..................... | H01Q 1/38 |
| 2019/0341696 A1* | 11/2019 | O'Connor | ................ | H01Q 1/38 |
| 2020/0028236 A1* | 1/2020 | Yeh | ........................ | H01Q 1/22 |
| 2020/0032026 A1* | 1/2020 | Nakamura | ............. | B32B 15/20 |
| 2020/0130330 A1* | 4/2020 | Kim | ........................ | B32B 21/08 |
| 2020/0307145 A1* | 10/2020 | Sargent | ................... | B32B 15/16 |
| 2021/0143539 A1* | 5/2021 | Yuan | ...................... | B32B 27/288 |
| 2021/0161038 A1* | 5/2021 | Yao | ...................... | C23C 18/1653 |
| 2021/0206139 A1* | 7/2021 | Johnston | ................ | B32B 15/18 |
| 2021/0400802 A1* | 12/2021 | Kim | ........................ | H01Q 1/38 |
| 2022/0059948 A1* | 2/2022 | Sayama | ............... | H01Q 9/0407 |
| 2022/0150334 A1* | 5/2022 | Yang | ..................... | C23C 16/303 |

FOREIGN PATENT DOCUMENTS

| | | | | |
|---|---|---|---|---|
| CN | 105658008 A | | 6/2016 | |
| CN | 105960131 A | * | 9/2016 | ............ B32B 15/08 |
| CN | 205621846 U | | 10/2016 | |
| CN | 106453701 A | | 2/2017 | |
| CN | 105644062 B | | 9/2018 | |
| CN | 109037945 A | * | 12/2018 | .......... H01Q 1/2208 |
| CN | 109429452 A | | 3/2019 | |
| CN | 110650605 A | | 1/2020 | |
| JP | 2017181911 A | * | 10/2017 | |
| JP | 6697759 B2 | | 5/2020 | |
| TW | 201715930 A | | 5/2017 | |
| TW | 202026142 A | | 7/2020 | |
| TW | 1729965 B | | 6/2021 | |
| WO | 2020153137 A1 | | 7/2020 | |

\* cited by examiner

COMPOSITE LAMINATE PLATE, HOUSING AND MOBILE COMMUNICATION DEVICE

RELATED APPLICATION

This application claims priority to an earlier Taiwan Application Serial Number 109142927, filed on Dec. 4, 2020 which is incorporated herein by reference in its entirety.

BACKGROUND

Field of Invention

The present invention relates to a composite laminate plate, a housing and a mobile communication device, and more particularly relates to a composite laminate plate, a housing and a mobile communication device with effect for light weight tendency and high signal intensity.

Description of Related Art

Mobile communication technology has been developed from the fourth generation (4G) to the fifth generation (5G), and frequency of communication is advanced to a range of 28 GHz (i.e. millimeter wave). Transfer rate and responding time thereof are both faster than long term evolution (LTE) of the 4G, thereby allowing large volume data to transmit in a high rate, therefore achieving applications of internet and internet of vehicles. However, capability of the millimeter wave of 5G for penetrating a barrier is poorer, and signals are faded significantly. Particularly, performances of an antenna in metal housing are significantly lowered. Additionally, the metal housing is heavier than that made from resin composite materials, such that it is disadvantageous for light-weight and thinning tendencies of mobile communication devices.

Now, resins or glasses are used to replace the metal to resolve the defects of the shielding effect and heavy weight of the metallic housing. However, appearance of the housing made from the resins or the glasses is poor because it does not equip with metallic texture, and further the housing has worse mechanical properties than the metallic housing. Besides, the metallic texture can be achieved by a transparent plastic layer as an outer layer and an antenna as an interior metal layer, but the quality of the housing is poor.

Therefore, there is a need to provide a new composite laminate plate, a new housing and a new mobile communication device to improve the aforementioned disadvantages of well-known composite laminate plates, well-known housings and well-known mobile communication devices.

SUMMARY

In view of the above problems, an aspect of the present invention provides a composite laminate plate. The composite laminate plate comprises a top metal layer having a through hole and an array antenna, and a wave transmissivity of a millimeter wave of the composite laminate plate can be enhanced by adjusting an area ratio of the array antenna to the through hole.

Another aspect of the present invention is to provide a housing comprising the aforementioned composite laminate plate.

Another aspect of the present invention is to provide a mobile communication device comprising the aforementioned housing.

According to an aspect of the present invention, a composite laminate plate is provided. The composite laminate plate comprises a top metal layer having a first through hole, a first fiber-reinforced resin layer having two opposite sides, a functional layer having a groove, an array antenna disposed in the groove and a bottom-layer structure. One of the two opposite sides of the first fiber-reinforced resin layer is adjacent to the top metal layer, the functional layer is adjacent to the other of the two opposite sides of the first fiber-reinforced resin layer, and the bottom-layer structure is adjacent to the functional layer and is disposed on an other side of the functional layer opposite to the first fiber-reinforced resin layer. The bottom-layer structure comprises a bottom metal layer disposed under the functional layer. The first through hole is disposed corresponding to the array antenna, and based on an area of the array antenna being 100%, an area of the first through hole relative to the array antenna is 10% to 80%.

According to an embodiment of the present invention, the composite laminate plate is composed of a plurality of metal sub-layers and a plurality of resin fiber sub-layers stacked alternately.

According to an embodiment of the present invention, the functional layer is made from a metallic material or a fiber-reinforced resin material.

According to another embodiment of the present invention, the composite laminate plate has a symmetric material structure in two opposite sides of a central interface or a central layer, and the composite laminate plate comprises a plurality of metal sub-layers and a plurality of resin fiber sub-layers.

According to another embodiment of the present invention, the bottom-layer structure selectively comprises a second fiber-reinforced resin layer and/or a metal layer, and the second fiber-reinforced resin layer and the metal layer are both disposed between the bottom metal layer and the functional layer.

According to another aspect of the present invention, the composite laminate plate has a thickness not more than 1.3 mm.

According to an embodiment of the present invention, the functional layer is made from a metallic material or a fiber-reinforced resin material.

According to another embodiment of the present invention, both of the top metal layer and the bottom metal layer comprise light metals or alloy thereof.

According to another embodiment of present invention, the array antenna and the first through hole are coaxial.

According to another embodiment of present invention, the composite laminate plate has a density not more than 2.4 g/cm$^3$.

According to another embodiment of present invention, the top metal layer further comprises a second through hole.

According to another embodiment of present invention, the second through hole is separated from the first through hole between 50 μm and 150 μm.

According to another aspect of the present invention, a housing is provided. The housing comprises the aforementioned composite laminate plate, in which the top metal layer comprises an oxidized layer treated by anodizing.

According to another aspect of the present invention, a mobile communication device is provided. The mobile communication device comprises the aforementioned housing.

In an application of the composite laminate plate, the housing and the mobile communication device of the present invention, in which the composite laminate plate includes a top metal layer with a through hole and an array antenna, and an area ratio of the array antenna to the through hole meets a specific range, thereby enhancing wave transmissivity of a millimeter wave. Moreover, the composite laminate plate has a specific material structure, such that it has good mechanical properties and low density. The housing and the mobile communication device made by the composite laminate plate have advantages of metallic texture, high signal intensity and excellent effect for light weight tendency.

BRIEF DESCRIPTION OF THE DRAWINGS

Now please refer to description below and accompany with corresponding drawings to more fully understand embodiments of the present invention and advantages thereof. It has to be emphasized that all kinds of characteristics are not drawn in scale and only for illustrative purpose. The description regarding to the drawings as follows.

DETAILED DESCRIPTION

A manufacturing and usage of embodiments of the present invention are discussed in detail below. However, it could be understood that embodiments provide much applicable invention conception which can be implemented in various kinds specific contents. The specific embodiments discussed are only for illustration, but not be a limitation of scope of the present invention.

The composite laminate plate of the present invention has a specific structure stacked with metal layers and fiber-reinforced resin layers to subject the composite laminate plate to have good mechanical strength (for example, specific flexural strength is not less than 95 kN·m/kg and specific flexural modulus is not less than 17500 kN·m/kg) and low density (for example, density is not higher than 2.4 g/cm$^3$) when the composite laminate plate has a thinnest thickness (for example, not thicker than 1.3 mm), therefore benefiting light weight of the housing and the mobile communication device. Additionally, a top metal layer of the composite laminate plate of the present invention has a through hole corresponding to an area and a position of an array antenna to enhance wave transmissivity of the millimeter-wave (for example, gain value of the antenna is higher than 0 dBi), therefore providing the housing and the mobile communication device with metallic texture and an applicability of millimeter wave communication.

As discussed extensively, the aforementioned specific stacked structure is obtained by alternately stacking a plurality of metal sub-layers and a plurality of resin fiber sub-layers, or there is a symmetric material structure on each two opposite sides of a central interface (while a total number of layers of the composite laminate plate is even) or a central layer (while a total number of layers of the composite laminate plate is odd) of the composite laminate plate comprising a plurality of metal sub-layers and a plurality of resin fiber sub-layers. In the following, the structure of the composite laminate plate of the present invention is described in detail with drawings, and aspects of the composite laminate plate comprising odd layers and even layers are respectively described.

Figure 1A:
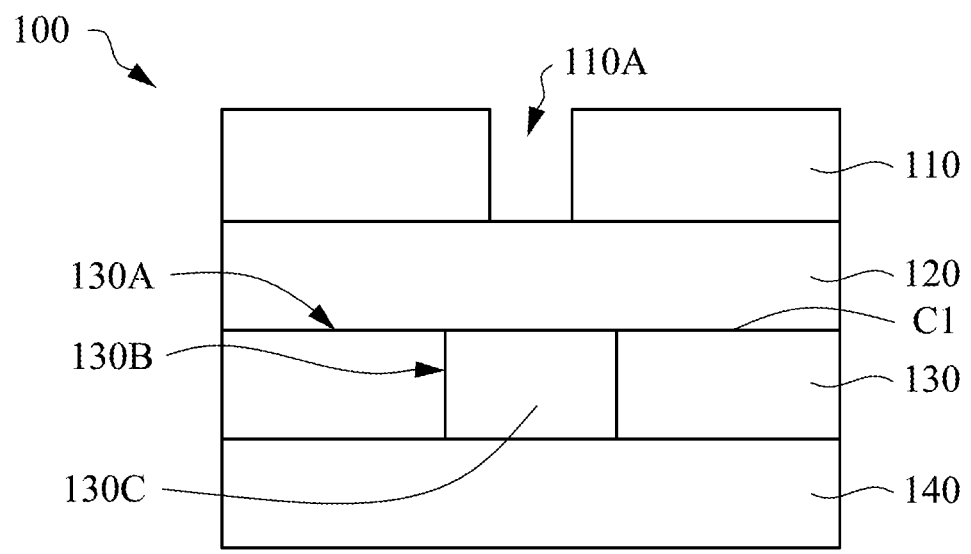
FIG. 1A illustrates a cross section schematic diagram of a composite laminate plate according to an embodiment of the present invention.

Referring to FIG. 1A, in some embodiments, a total number of layers of a composite laminate plate 100 is 4. In this case, the composite laminate plate 100 has a symmetric material structure in two opposite sides of a central interface C1. When the total number of layers of the composite laminate plate 100 is even, the aforementioned central interface C1 is an interface of the middle two layers (i.e. a first fiber-reinforced resin layer 120 and a functional layer 130).

The composite laminate plate 100 comprises a top metal layer 110, the first fiber-reinforced resin layer 120, the functional layer 130 and a bottom-layer structure 140. For purpose of explanation, the total number of layers of the composite laminate plate 100 in the description and drawings of the present invention is regarded the top metal layer 110 as a first layer, the first fiber-reinforced resin layer 120 as a second layer, and so on. However, a person having ordinary skill in the art understands that when the top metal layer 110 is regarded as a last layer, the first fiber-reinforced resin layer 120 is regarded as the second to the last layer. Similarly, the number of the other layers is counted reversely.

The top metal layer 110 has a through hole 110A, and the through hole 110A is disposed corresponding to an array antenna 130C described below to provide a channel for receiving millimeter-wave signals, thereby preventing shielding effect of signals. The top metal layer 110 is made from metallic materials. If the top metal layer 110 is not made from metallic materials, it would not be suitable for an anodic oxidation treatment, and could not provide the composite laminate plate 100 with an appearance of metallic texture. It can be understood that although spray painting or the like can be used to improve the appearance of texture, the resulted appearance is still incomparable with the metallic appearance.

In some embodiments, the materials of the top metal layer 110 comprise light metals or alloy thereof. The light metal of the present invention refers to metals with lighter atomic weight and a density of not more than 5.0 g/cm$^3$. The aforementioned alloy of the light metals refers to an amount of the light metals is not less than 85% of the total weight of the alloy, and preferably can be 90% to 99%. When the materials of the top metal layer 110 comprise the light metals and the alloy thereof, it can improve effect of the light weight tendency of the composite laminate plate 100. For example, specific examples of the materials of the top metal layer 110 can comprise but be not limited to magnesium, titanium, aluminum and the alloy thereof, and preferably can be the alloy of aluminum.

The first fiber-reinforced resin layer 120 is adjacent to and is disposed under the top metal layer 110 (i.e. the first fiber-reinforced resin layer 120 is a second layer) to cover and protect the array antenna 130C. The first fiber-reinforced resin layer 120 is made from fiber-reinforced resin materials. If the materials of the first fiber-reinforced resin layer 120 is not the fiber-reinforced resin materials, a decreasing of the mechanical strength caused by the aforementioned through hole 110A is difficult to be compensated, such that the mechanical strength of the composite laminate plate 100 is decreased. If the materials of the second layer are metal, signal transmissivity of millimeter wave will be shielded to lower wave transmissivity of millimeter-wave signals of the composite laminate plate 100.

The aforementioned fiber-reinforced resin materials are made from a composite resin reinforced with fibers. In some specific examples, the resin can comprise a thermoplastic and thermosetting resin, for example, polycarbonate and epoxy resin. Preferably, the resin can be thermoplastic resin to facilitate processing and molding. In some specific examples, the fibers can comprise non-conductive fibers, for example, glass fibers and Kevlar fibers. Preferably, the fibers can be quartz glass fiber to enhance wave transmissivity of the millimeter-wave signals of the composite laminate plate 100 with a high insulatively of fibers.

In some embodiments, a weight ratio of the resin to the fibers in the first fiber-reinforced resin layer 120 is 0.2 to 0.7. When the weight ratio of the resin to the fibers is in the aforementioned range, the resulted first fiber-reinforced resin layer 120 has good strength to enhance the mechanical strength of the composite laminate plate 100. Preferably, the weight ratio of the resin to the fibers can be 0.2 to 0.3.

The functional layer 130 is adjacent to and is disposed under the first fiber-reinforced resin layer 120, i.e. the functional layer 130 is a third layer. Viewed from the top surface 130A, the functional layer 130 has a groove 130B. The groove 130B is used to accommodate the array antenna 130C described below. Depending on the stacked structure of the composite laminate plate 100, in some embodiments, the materials of the functional layer 130 can be metallic materials. In other embodiments, the materials of the functional layer 130 can be resin materials or fiber-reinforced resin materials. It should be noted that the metallic materials, the resin materials and the fiber-reinforced resin materials herein are described as above and are not illustrated any more here. Besides, if the functional layer 130 is made from the metallic material, insulation materials will have to be filled in the groove 130B between the array antenna 130C and the functional layer 130 to prevent electrical failures of the array antenna 130C caused by the metallic material because the metallic material is conductive material.

In some embodiments, an array arrangement of the array antenna 130C can use 1×4 or 2×2 as a unit, for example: 1×4, 2×2, 2×4 or 4×4 of array arrangement. In some specific examples, array antenna 130C can be planar antenna, but not flexible antenna to reduce volume of the array antenna 130C and further reduce a thickness of the composite laminate plate 100. In some specific examples, the array antenna 130C has a signal wire to transmit a signal to processor and other components of a mobile communication device.

Figure 1B:
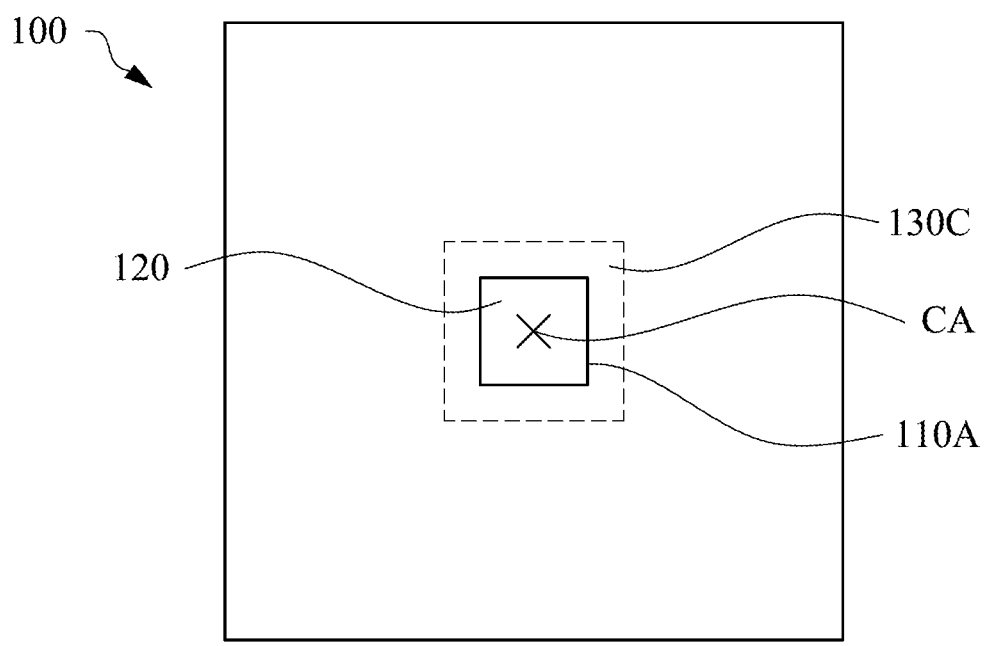
FIG. 1B illustrates a top view schematic diagram of a composite laminate plate according to an embodiment of the present invention.

As mentioned above, the through hole 110A is disposed corresponding to the array antenna 130C. The term "disposed corresponding to" herein refers that a projected area of the through hole 110A is overlapped with a projected area of the array antenna 130C. When the through hole 110A is not disposed corresponding to the array antenna 130C, the shielding effect for millimeter-wave signal of the composite laminate plate 100 is increased. Preferably, the array antenna 130C and the through hole 110A is coaxial to enhance wave transmissivity of millimeter wave, as shown in FIG. 1B. In this figure, CA represents a co-axis of the array antenna 130C and the through hole 110A.

Moreover, based on an area of the array antenna 130C being 100%, an area of the through hole 110A relative to the array antenna 130C is 10% to 80%. When the area of the through hole 110A is less than 10%, the shielding effect for millimeter-wave signal of the composite laminate plate 100 is increased. When the area of the through hole 110A is more than 80%, the through hole 110A with an oversize area lowers an appearance of texture of the resulted housing. Preferably, the area of the through hole 110A can be 15% to 25%, and more preferably be 20%.

Figure 1C:
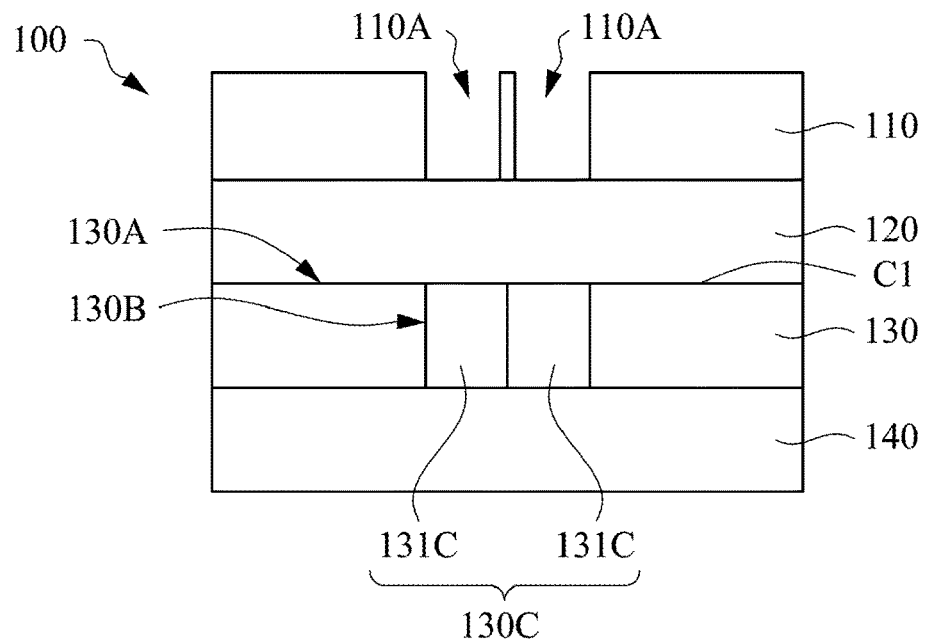
FIG. 1C illustrates a cross section schematic diagram of a composite laminate plate according to an embodiment of the present invention.

Besides, referring to FIG. 1C, in some embodiments, the top metal layer 110 can be equipped with the corresponding through holes 110A according to each unit 131C of the array antenna 130C. For example, when the array arrangement of the array antenna 130C is an array with two 2×2 units 131C (i.e. 2×4 of array arrangement), one array with 2×2 unit 131C is disposed corresponding to one through hole 110A, and the other array with 2×2 unit 131C is disposed corresponding to the other through hole 110A, such that the composite laminate plate 100 has two through holes 110A. When each of units 131C of the array antenna 130C is disposed corresponding to one through hole 110A, the appearance can be beautified more optionally.

In some specific examples, when the top metal layer 110 has a plurality of the through holes 110A, a distance between two adjacent through holes 110A is 50 µm to 150 µm. When the distance between two adjacent through holes 110A is 50 µm to 150 µm, a gain value of the array antenna 130C of the composite laminate plate 100 is adequate (i.e. positive).

Referring to FIG. 1A again, the bottom-layer structure 140 is adjacent to and is disposed under the functional layer 130. The bottom-layer structure 140 can comprise a bottom metal layer. When a total number of layers of the composite laminate plate 100 is 4, the bottom-layer structure 140 is the bottom metal layer. The bottom metal layer is the bottommost layer of the composite laminate plate 100 (i.e. the bottommost layer opposite to the top metal layer 110). Depending on the stacked structure of the composite laminate plate 100, the functional layer 130 is a fiber-reinforced resin layer.

In some embodiments, the metal layer 110 and the metal layer 140 made from metallic materials can have the same or different thickness and the fiber-reinforced resin layer 120 and the fiber-reinforced resin layer 130 made from fiber-reinforced resin materials can have the same or different thickness. There are no specific limitations to the thicknesses of the metal layers 110 and 140 and the fiber-reinforced resin layers 120 and 130, but those should be achieved the purpose of the symmetry of the aforementioned symmetric structure when the composite laminate plate 100 is a symmetric structure. For example, the thickness of the metal layers 110 and 140 is 0.10 mm to 0.35 mm, and preferably can be 0.15 mm to 0.30 mm. When the thickness of the metal layers 110 and 140 is 0.10 mm to 0.35 mm, the mechanical strength of the composite laminate plate 100 can be enhanced. The thickness of the fiber-reinforced resin layers 120 and 130 is 0.15 mm to 0.25 mm, and preferably can be 0.20 mm. When the thickness of the fiber-reinforced resin layers 120 and 130 is 0.15 mm to 0.25 mm, the mechanical strength of the composite laminate plate 100 can be enhanced.

In some embodiments, the composite laminate plate 100 has a thickness not more than 1.3 mm for light weight and thinning tendencies of the housing and the mobile communication device. Preferably, the thickness of the composite laminate plate 100 can be 0.6 mm to 1.2 mm.

In some embodiments, the composite laminate plate 100 has a density not more than 2.4 $g/cm^3$ and preferably 1.8 $g/cm^3$ to 2.2 $g/cm^3$. When the density of the composite laminate plate 100 is not more than 2.4 $g/cm^3$, effect for light weight tendency of the composite laminate plate 100 can be enhanced.

Figure 2:
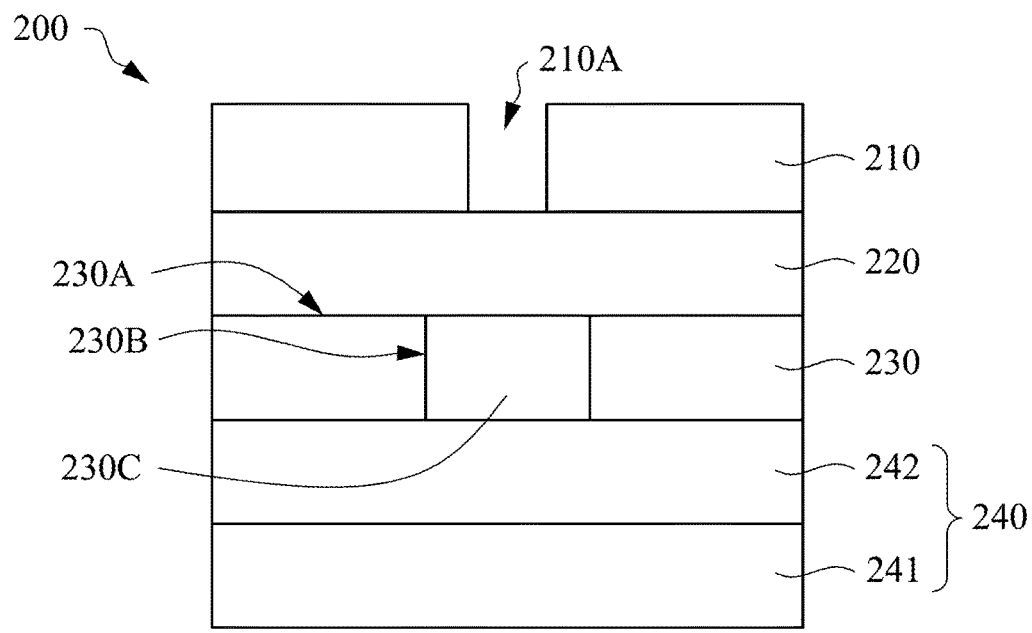
FIG. 2 illustrates a cross section schematic diagram of a composite laminate plate according to other embodiment of the present invention.

Referring to FIG. 2, in other embodiments, a total number of layers of a composite laminate plate 200 is odd, such that the composite laminate plate 200 has a central layer but not a central interface. In the composite laminate plate 200, a first layer is a top metal layer 210, a second layer is a first fiber-reinforced resin layer 220, and a third layer is a functional layer 230. It can be understood that the functional layer 230 is the central layer. The top metal layer 210 and the first fiber-reinforced resin layer 220 are the same with the aforementioned top metal layer 110 and the first fiber-reinforced resin layer 120 in FIG. 1A, such that they are not illustrated any more here. In the composite laminate plate 200, the functional layer 230 can be made from metallic materials or fiber-reinforced resin materials. In a bottom-layer structure 240 of the composite laminate plate 200, except for a bottom metal layer 241, a bottom-layer structure 240 can further comprise a fiber-reinforced resin layer 242 to meet the total number of layers of the composite laminate plate 200. The fiber-reinforced resin layer 242 is disposed between the functional layer 230 and the bottom metal layer 241. Corresponding to the central layer, when the composite laminate plate 200 has the symmetric material structure, the fiber-reinforced resin layer 242 should be made from the fiber-reinforced resin materials according to the material of the first fiber-reinforced resin layer 220. Furthermore, if the functional layer 230 is made from the metallic materials, except for the symmetric material structure, the composite laminate plate 200 can be composed of metal sub-layers and resin fiber sub-layers stacked alternately. The metallic materials and the fiber-reinforced resin materials of the aforementioned functional layer 230 are described as above, and the fiber-reinforced resin materials of the fiber-reinforced resin layer 242 are described as above, such that they are not illustrated any more here.

Figure 3:
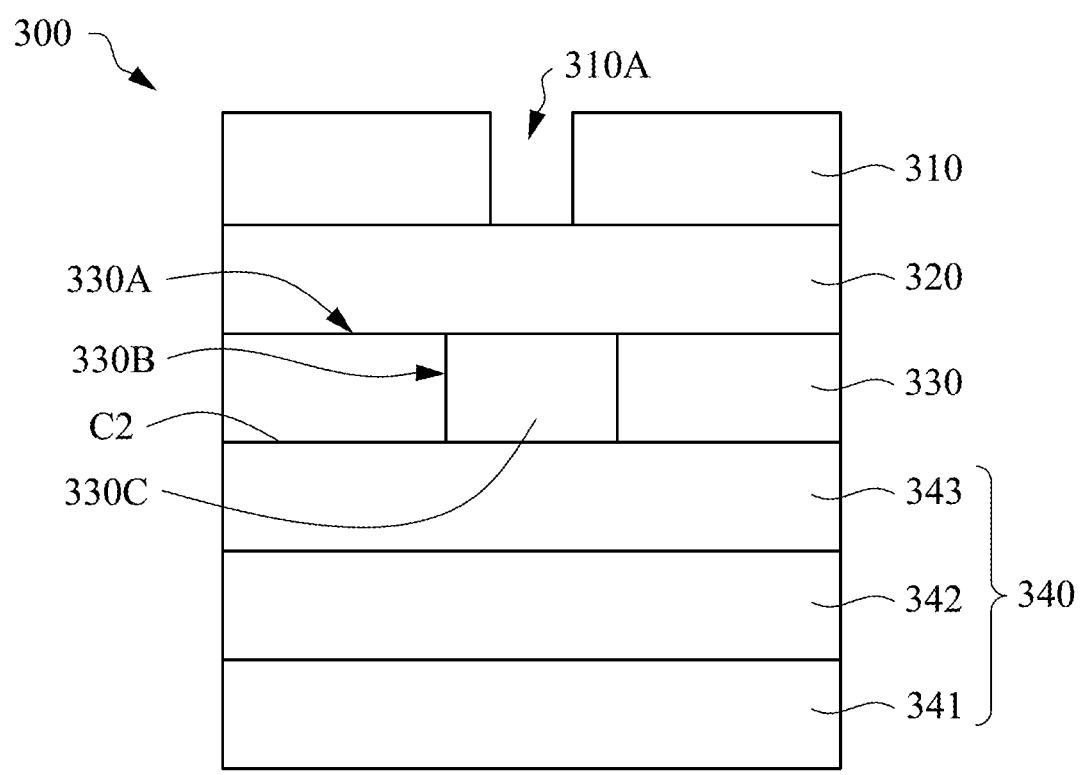
FIG. 3 illustrates a cross section schematic diagram of a composite laminate plate according to another embodiment of the present invention.

Referring to FIG. 3, a configuration of a composite laminate plate 300 is substantially similar to that of the composite laminate plate 200 and differences therebetween reside in that a bottom-layer structure 340 of the composite laminate plate 300 further comprises a fiber-reinforced resin layer 343 and the fiber-reinforced resin layer 343 is disposed between a functional layer 330 and a fiber-reinforced resin layer 342. Since a total number of layers of the composite laminate plate 300 is 6, the composite laminate plate 300 has a central interface C2 between the functional layer 330 and the fiber-reinforced resin layer 343. Corresponding to the central interface C2, the functional layer 330 has a symmetric structure, so that according to material (i.e. fiber-reinforced resin materials) of a first fiber-reinforced resin layer 320, the fiber-reinforced resin layer 342 should be made from the fiber-reinforced resin materials, too. Furthermore, the functional layer 330 can be made from the metallic materials or the fiber-reinforced resin materials, so that, a next sub-layer adjacent to the functional layer 330 correspondingly is made from the metallic materials or the fiber-reinforced resin materials based on the symmetric structure of the composite laminate plate 300. For example, if the functional layer 330 is made from the fiber-reinforced resin materials, the next sub-layer adjacent to the functional layer 330 is the fiber-reinforced resin layer 343. It can be understood that since a top metal layer 310 is made from the metallic materials, the first fiber-reinforced resin layer 320 is made from the fiber-reinforced resin materials, and a bottom metal layer 341 is made from the metallic materials, the composite laminate plate 300 does not have the structure alternately stacked with the metal sub-layers and the resin fiber sub-layers.

In the aforementioned embodiments, when the material of the functional layer 330 is the metallic material, an array antenna 330C directly contacts the first fiber-reinforced resin layer 320 to prevent from the shielding effect caused by the metallic material of the functional layer 330, thereby enhancing the wave transmissivity of millimeter-wave signals of the composite laminate plate 300.

Besides, in other embodiments, it should be noted that when successively adjacent layers are made from the same material, they can be regarded as a layer with an increasing thickness. For example, when the successive two layers are two metal layers, they can be regarded as a metal layer with a double thickness. Therefore, the aforementioned counting the number of layers should correspondingly be modified.

Another aspect of the present invention is to provide a housing. The housing comprises the aforementioned composite laminate plate. In some embodiments, the housing is used as a housing of a mobile communication device. In some specific examples, the mobile communication device comprises a computer, a mobile phone and a panel, and preferably comprises a notebook. As discussed extensively, the outermost layer of the composite laminate plate is made from the metallic materials and the metallic materials can be subjected to an anodic oxidation treatment to provide the housing with an appearance of the metallic texture. In some embodiments, a top metal layer of the housing has an oxidized layer treated by anodizing. Next, good mechanical strength and a low density of the composite laminate plate can let the housing achieve light weight tendency and have a good protection. Additionally, an array antenna of the composite laminate plate has a wave transmissivity of millimeter wave to provide the housing an application for a millimeter-wave communication device. When the housing does not comprise the composite laminate plate, the housing can not have the metallic texture, the effect for light weight tendency and the application for a millimeter-wave communication device.

In some embodiments, thermoplastic resin is used as materials of the fiber-reinforced resin layer in the composite laminate plate, and the housing is manufactured by a metal pretreatment, a positioning and stacking process, a hot compression molding process, the anodic oxidation treatment of following top metal layer, a cutting process and other process.

Another aspect of the present invention is to provide a mobile communication device. The mobile communication device comprises the aforementioned housing. An array antenna of the housing provides signal transmission without shielding effect, so that there is no need to build an antenna in the mobile communication device, thereby reducing its volume and enhancing the signal intensity. Next, the housing has an appearance of metallic texture and excellent effect of the light weight tendency, so that an integrated housing with the appearance of metallic texture can be manufactured to provide the mobile communication device with an integrity and beauty of the appearance. When the mobile communication device does not comprise the aforementioned housing, the mobile communication device can not have effect of the light weight tendency, the function for transmitting millimeter-wave signals and the integrity and the beauty of the appearance.

The following embodiments are used to illustrated the applications of the present invention, but they are not used to limit the present invention, it could be made various changes or modifications for a person having ordinary skill in the art without apart from the inspire and scope of the present invention.

Manufacture of Composite Laminate Plate

Embodiment 1

In a composite laminate plate of Embodiment 1, 5000 series aluminum alloy, 1000 series aluminum alloy, 2×4 of array antennas and glass fiber reinforced polycarbonate composite material were stacked according to materials and numbers of layers shown in Table 1, and then they was subjected to a hot compression molding process (a temperature is 240° C., compression time is 3 minutes, and a pressure is 20 kgf/cm$^2$) to manufacture the composite laminate plate of Embodiment 1 in which an area of a through hole is 20% and the through hole was coaxially disposed with the array antenna. The composite laminate plate had two through holes, and a distance between the two through holes was 50 μm to 150 μm. The resulted composite laminate plate is evaluated by evaluation methods described below, and specific conditions and results of Embodiment 1 were shown in Table 1.

Embodiments 2 to 7 and Comparative Embodiment 1

Composite laminate plates of Embodiments 2 to 7 were practiced with the same method as in Embodiment 1 by using different materials, numbers of layers and stacking processes. Besides, the composite laminate plate in Comparative Embodiment 1 was replaced with 5052 aluminum alloy.

Evaluation Methods

1. Density

The densities of composite laminate plates were measured according to a method used by a person having ordinary skill in the art and an eligibility criteria of the density was not more than 2.4 g/cm$^3$.

2. Specific Flexural Strength and Specific Flexural Modulus

The specific flexural strength and the specific flexural modulus were obtained by dividing flexural strength and flexural modulus by the density of the corresponding composite laminate plate, and the flexural strength and the flexural modulus were measured according to standard test methods (ASTM D790). An eligibility criteria of the specific flexural strength was not less than 95 kN·m/kg and an eligibility criteria of the specific flexural modulus was not less than 17500 kN·m/kg.

3. Wave Transmissivity of Millimeter Wave

The wave transmissivity of the millimeter wave was measured by an over-the-air (OTA) test method. After the millimeter wave with a frequency of 28.0 GHz was transmitted to the array antenna, a full-phase dipole antenna was defined as zero to obtain gain values, thereby evaluating the wave transmissivity of the millimeter wave of the composite laminate plate of Embodiment 5. When the gain value in a specific direction was positive, a gain enhancement of the millimeter wave in the specific direction was generated, but not vice versa.

TABLE 1

| | | Embodiment | | | | | | | |
|---|---|---|---|---|---|---|---|---|---|
| | | 1 | | 2 | | 3 | | 4 | |
| | Number of layers | Material | Thickness (mm) | Material | Thickness (mm) | Material | Thickness (mm) | Material | Thickness (mm) |
| Structure | 1 | M1 | 0.3 | M2 | 0.3 | M1 | 0.2 | M2 | 0.15 |
| | 2 | G | 0.2 | G | 0.2 | G | 0.2 | G | 0.2 |
| | 3 | M2 | 0.15 | M2 | 0.15 | M2 | 0.15 | M1 | 0.1 |
| | 4 | G | 0.2 | G | 0.2 | G | 0.2 | G | 0.2 |
| | 5 | M1 | 0.3 | M2 | 0.3 | M1 | 0.2 | M2 | 0.15 |
| | Total thickness (mm) | 1.15 | | 1.15 | | 0.95 | | 0.80 | |
| Evaluation results | Density (g/cm$^3$) | 2.331 | | 2.287 | | 2.052 | | 2.090 | |
| | Specific flexural strength (kN·m/kg) | 154 | | 110 | | 165 | | 129 | |
| | Specific flexural modulus (kN·m/kg) | 19399 | | 17927 | | 23879 | | 18182 | |
| | Gain value (dBi) | — | | — | | — | | — | |

| | | Embodiment | | | | | | Comparative Embodiment | |
|---|---|---|---|---|---|---|---|---|---|
| | | 5 | | 6 | | 7 | | 1 | |
| | Number of layers | Material | Thickness (mm) | Material | Thickness (mm) | Material | Thickness (mm) | Material | Thickness (mm) |
| Structure | 1 | M1 | 0.3 | M2 | 0.3 | M2 | 0.2 | M3 | 0.8 |
| | 2 | G | 0.2 | G | 0.2 | G | 0.2 | — | — |
| | 3 | G | 0.2 | G | 0.2 | G | 0.2 | — | — |
| | 4 | M1 | 0.3 | M2 | 0.3 | M2 | 0.2 | — | — |
| | 5 | — | — | — | — | — | — | — | — |
| | Total thickness (mm) | 1.00 | | 1.00 | | 0.80 | | 0.80 | |
| Evaluation results | Density (g/cm$^3$) | 2.253 | | 2.309 | | 2.130 | | 2.75 | |
| | Specific flexural strength (kN·m/kg) | 241 | | 113 | | 108 | | 144 | |

TABLE 1-continued

| | | | | |
|---|---|---|---|---|
| Specific flexural modulus (kN · m/kg) | 35064 | 27285 | 17840 | 23200 |
| Gain value(dBi) | 5 | — | — | — |

"M1" represented 5000 series aluminum alloy, a surface modification and a hole formation were performed in the aforementioned aluminum alloy and area thereof was 30 cm$^2$ × 30 cm$^2$.
"M2" represented 1000 series aluminum alloy, a surface modification and a hole formation were performed in the aforementioned aluminum alloy and area thereof was 30 cm$^2$ × 30 cm$^2$.
"M3" represented 5052 series aluminum alloy, a surface modification and a hole formation were performed in the aforementioned aluminum alloy and area thereof was 30 cm$^2$ × 30 cm$^2$.
"G" represented glass fiber reinforced polycarbonate composite material and area thereof was 30 cm$^2$ × 30 cm$^2$.
"—" represented that the material was not used, or the evaluation test was not conducted.

Referring to Table 1, the composite laminate plates of Embodiments 1 to 7 can still have good mechanical strength in the condition which densities thereof were reduced. Thus, the composite laminate plate of the present invention can have better effect for light weight tendency and good mechanical strength. Additionally, the composite laminate plate of Embodiment 5 had good wave transmissivity of the millimeter wave.

In summary, the composite laminate plate of the present invention comprises the top metal layer with the through hole and the array antenna, and the area ratio of the array antenna to the through hole meets the specific range, thereby enhancing wave transmissivity of the millimeter wave. Besides, the composite laminate has the specific structure of configuration, such that it can have good mechanical properties and a low density. Thus, the housing and the mobile communication device made by the composite laminate have advantages of metallic texture, high signal intensity and excellent effect for light weight tendency.

Although the present invention has been disclosed in several embodiments as above mentioned, these embodiments do not intend to limit the present invention. Various changes and modifications can be made by those of ordinary skills in the art of the present invention, without departing from the spirit and scope of the present invention. Therefore, the claimed scope of the present invention shall be defined by the appended claims.

What is claimed is:

1. A composite laminate plate, comprising:
    a top metal layer, having a first through hole;
    a first fiber-reinforced resin layer, having two opposite sides, wherein one of the two opposite sides is adjacent to the top metal layer;
    a functional layer, adjacent to an other of the two opposite sides of the first fiber-reinforced resin layer, wherein the functional layer has a groove, and the functional layer is made from a metallic material;
    an array antenna, disposed in the groove, wherein the first through hole is disposed corresponding to the array antenna, the array antenna directly contacts the first fiber-reinforced resin layer, and the first fiber-reinforced layer completely covers over the array antenna;
    an insulation material filled in the groove between the array antenna and the functional layer; and
    a bottom-layer structure, adjacent to the functional layer and disposed on an other side of the functional layer opposite to the first fiber-reinforced resin layer, wherein the bottom-layer structure comprises a bottom metal layer disposed under the functional layer; and based on an area of the array antenna being 100%, an area of the first through hole relative to the array antenna is 10% to 80%.

2. The composite laminate plate of claim 1, wherein the composite laminate plate is composed of a plurality of metal sub-layers and a plurality of resin fiber sub-layers stacked alternately.

3. The composite laminate plate of claim 1, wherein the composite laminate plate has a symmetric material structure in two opposite sides of a central interface or a central layer, and the composite laminate plate comprises a plurality of metal sub-layers and a plurality of resin fiber sub-layers.

4. The composite laminate plate of claim 1, wherein the bottom-layer structure further comprises a second fiber-reinforced resin layer and/or a metal layer disposed between the bottom metal layer and the functional layer.

5. The composite laminate plate of claim 1, wherein the composite laminate plate has a thickness not more than 1.3 mm.

6. The composite laminate plate of claim 1, wherein both of the top metal layer and the bottom metal layer comprise light metals or alloys thereof.

7. The composite laminate plate of claim 1, wherein the array antenna and the first through hole are coaxial.

8. The composite laminate plate of claim 1, wherein the composite laminate plate has a density not more than 2.4 g/cm$^3$.

9. The composite laminate plate of claim 1, wherein the top metal layer further comprises a second through hole.

10. The composite laminate plate of claim 9, wherein the second through hole is separated from the first through hole between 50 μm and 150 μm.

11. A housing, comprising the composite laminate plate of claim 1,
    wherein the top metal layer comprises an oxidized layer treated by anodizing.

12. A mobile communication device, comprising the housing of claim 11.

* * * * *